(12) United States Patent
Chang

(10) Patent No.: US 6,569,761 B2
(45) Date of Patent: May 27, 2003

(54) METHOD FOR SHRINKING CRITICAL DIMENSION

(75) Inventor: Ching-Yu Chang, I-Lan (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/903,667

(22) Filed: Jul. 13, 2001

(65) Prior Publication Data

US 2002/0055252 A1 May 9, 2002

(30) Foreign Application Priority Data

Nov. 9, 2000 (TW) ........................................ 89123652 A

(51) Int. Cl.⁷ ......................................... H01L 21/4763
(52) U.S. Cl. ....................................... 438/637; 438/733
(58) Field of Search ................................. 438/637, 733, 438/761, 782

(56) References Cited

U.S. PATENT DOCUMENTS

| | | | | |
|---|---|---|---|---|
| 5,622,814 A | * | 4/1997 | Miyata et al. | 430/314 |
| 5,834,159 A | * | 11/1998 | Stolmeijer | 430/312 |
| 6,007,733 A | * | 12/1999 | Jang et al. | 216/80 |
| 6,117,766 A | * | 9/2000 | Yoan et al. | 438/637 |
| 6,242,344 B1 | * | 6/2001 | Koh et al. | 438/638 |
| 6,242,346 B1 | * | 6/2001 | Sun | 438/669 |
| 2001/0013045 A1 | * | 8/2001 | Palmans et al. | 438/622 |

* cited by examiner

*Primary Examiner*—Amir Zarabian
*Assistant Examiner*—Pamela Perkins

(57) ABSTRACT

In accordance with the present invention, a method is provided for shrinking critical dimension in semiconductor processes. This method comprises a step of performing an over-exposure process to a photosensitive layer to form a patterned photosensitive layer on a substrate by using a patterned reticle. Due to the unexposed region of the photosensitive layer being diminished by over-exposure the critical dimension is shrunk. Then, a sacrificial layer is applied for the purpose of pattern reverse-transferring. Next, the patterned photosensitive layer is removed such that the pattern is transferred to the sacrificial layer with a shrunk critical dimension. In cooperation of the present exposure technology with the present invention, the shrinkage of a critical dimension is accomplished, for example, using an I-line exposure light source in a critical dimension of 0.25 $\mu$m process, or using a deep UV (ultraviolet) exposure light source in a critical dimension of 0.13 $\mu$m process.

19 Claims, 5 Drawing Sheets

METHOD FOR SHRINKING CRITICAL DIMENSION

CROSS REFERENCE TO RELATED APPLICATION

This application claims the priority benefit of Taiwan application serial no. 89,123,652, filed Nov. 9, 2000, the full disclosure of which is incorporated herein by reference.

BACKGROUND OF THE INVENTION

1. Field of the Invention

The present invention generally relates to a method for shrinking critical dimension (CD) in semiconductor processes, and more particularly to a method for shrinking critical dimension by performing an over-exposure process to a photosensitive layer using a patterned reticle.

2. Description of the Prior Art

Critical dimension (CD), which represents the smallest line width obtainable in a photolithography process, is one of the key factors in the semiconductor process. It is well known that as the sizes of semiconductor devices are continually being reduced, the critical dimension has also significantly shrunk. There are three major ways to shrink the critical dimension in the prior art techniques which include, lithography technique, photoresist reflow technique, and the polymer deposition technique. The shrinkage of the critical dimension is accomplished by directly reducing the critical dimension of the pattern of the reticle in the application of the photolithography technique, and other two techniques reduce the size of semiconductor devices by the shrinkage of the critical dimension of the pattern of the photoresist.

The photolithographic process utilizes the reduction in wavelength of the exposure light source to restrain the light diffraction, which results in the proximity effects; in other words, the resolution is improved by reducing the wavelength of the exposure light source. For example, a critical dimension of 0.3 μm requires an exposure light source with a wavelength about 365 nm (I-line), a critical dimension of 0.2 μm requires an exposure light source with a wavelength about 248 nm (deep UV), and a critical dimension of 0.18 μm requires an exposure light source with a wavelength about 193 nm. However, since the depth of focus is directly proportional to the wavelength of exposure light source, the reduction in wavelength results in differences in the photoresist topography and decreases the throughput in the lithography process when a thicker photoresist is applied. Moreover, It is very difficult, costly and time consuming to develop a light source with a shorter wavelength, and a development in redesigning a lithography system for the new light source is compulsory.

The photoresist reflow technique and the polymer deposition technique utilize a patterned reticle with a greater critical dimension to form a patterned photoresist with a smaller critical dimension. The disadvantage of implementing the photoresist reflow process is that the thermal treating process is very difficult to control, and the redistribution of the photoresist can not be ideally controlled nor stopped from flowing into the topographic profile. The drawback of the polymer deposition process is that the etching process later applied is greatly affected and a uniform polymer distribution is difficult to secure.

According to the above description, in the development of semiconductor device fabrication, the shrinkage of the critical dimension is an important task. It is desired to provide a method for not only shrinking the critical dimension but also preventing drawbacks in the prior art technique.

SUMMARY OF THE INVENTION

In accordance with the present invention, a method for shrinking critical dimension of semiconductor devices is provided.

It is another object of this invention that a method for shrinking critical dimension by performing an over-exposure process to a photosensitive layer using a patterned reticle is provided.

It is a further object of this invention that a method for shrinking critical dimension by over-exposing a photosensitive layer resulting in the shrinkage of an unexposed region is provided.

It is yet another further object of this invention that a method for shrinking critical dimension associated with the present exposure technology is provided, for example, an I-line exposure light source is used for a critical dimension of 0.25 μm process, or a deep UV (ultraviolet) exposure light source is used for a critical dimension of 0.13 μm process.

In accordance with the present invention, a method for shrinking critical dimension is disclosed. The method comprises a step of forming a photosensitive layer on a substrate. Then, a patterned reticle with a pattern is provided and aligned with the substrate. Next, an over-exposure process is performed to the photosensitive layer to form a patterned photosensitive layer by using the provided patterned reticle. Then, a sacrificial layer is formed on the substrate and the patterned photosensitive layer. The sacrificial layer is anisotropically etched to expose the patterned photosensitive layer. Then, the patterned photosensitive layer is removed and the pattern is reverse-transferred to the sacrificial layer. Thus, due to the over-exposure process increases the exposed region and reduces the unexposed region, the line width of the reverse-transferred pattern (used as the unexposed region) in the sacrificial layer is reduced to accomplish the goal of shrinking the critical dimension.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width, and depth, when fabricated in an actual device.

Some sample embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Figure 1:
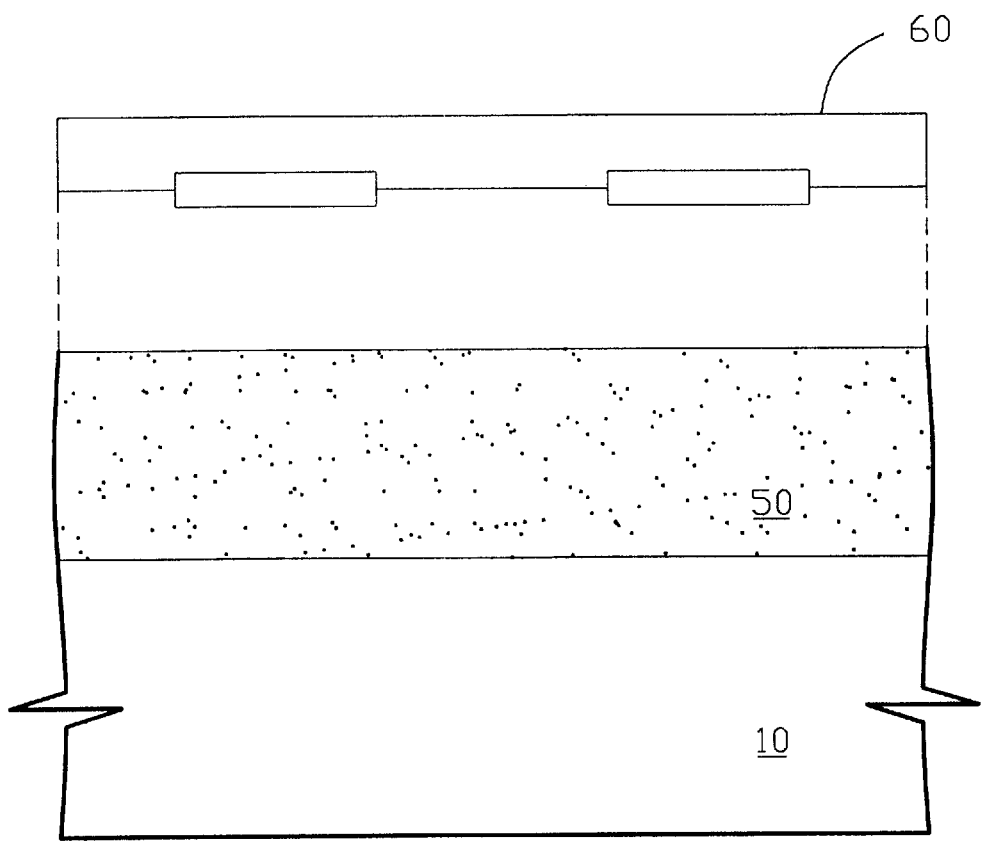
FIG. 1 is a schematic cross-sectional view of a photosensitive layer formed on the substrate and the provided patterned reticle in accordance with the present invention.

Referring to FIG. 1, a substrate 10 is provided. Then, a photosensitive layer 50 is formed on the substrate 10 by spin coating technique. The photosensitive layer 50 can be either a positive photoresist or a negative photoresist, such as a positive photoresist used in the embodiment. In other words, the exposed regions are dissolved by a developer after an exposure step. Then, a reticle 60 having a pattern such as a line width, a spacing, or a contact hole, which is intended transferring to the substrate 10, is provided and aligned with the substrate 10. Quartz glass is one of the materials for making the reticle 60 due to its low thermal expansion coefficient, low sodium content, high chemical stability, and high optical transmission, and an opaque chromium film and chromium oxide are coated to reduce the reflectivity. The light can not transmit through the reticle where coated with chromium. The light transmits through the quartz glass exposing onto a wafer coated with photoresist. After the development process a variety of patterns are formed. The reticle 60 can be a binary intensity mask (BIM) or a phase shift mask (PSM) such as Levenson alternative PSM or half-tone PSM.

Figure 2A:
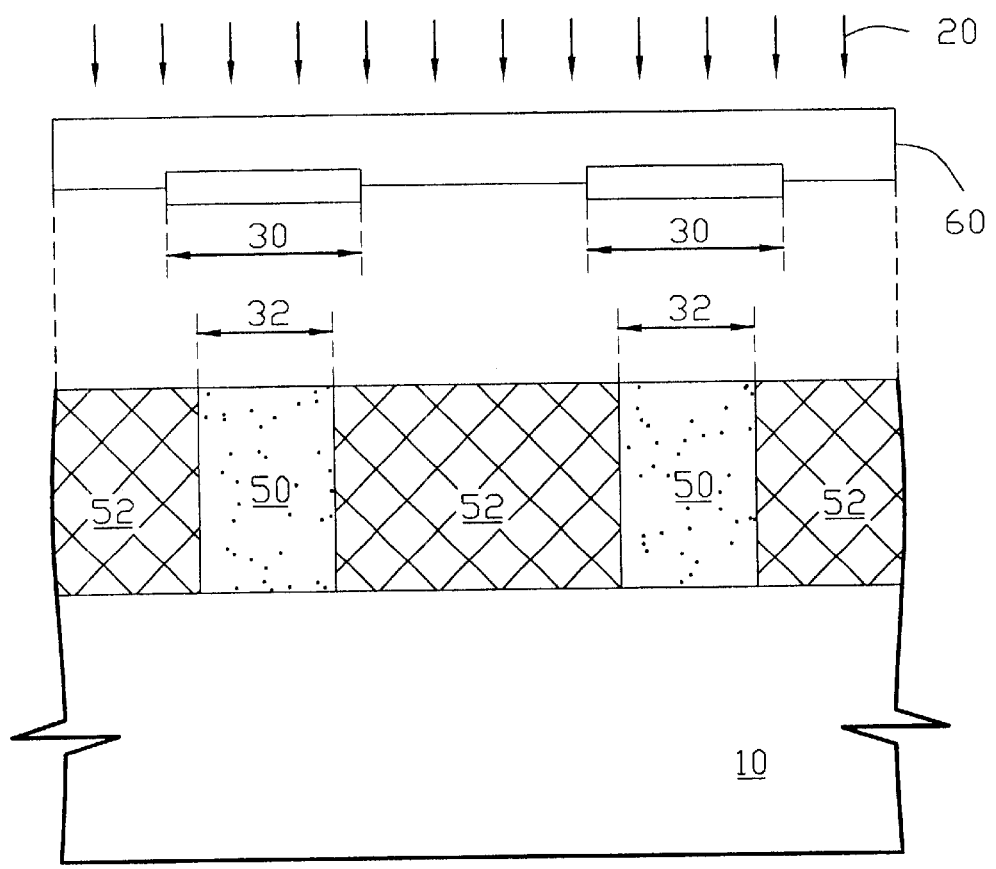
FIGS. 2A and 2B are a cross-sectional view of performing the exposure process to the structure and a top view of substrate shown in FIG. 1.
Figure 2B:
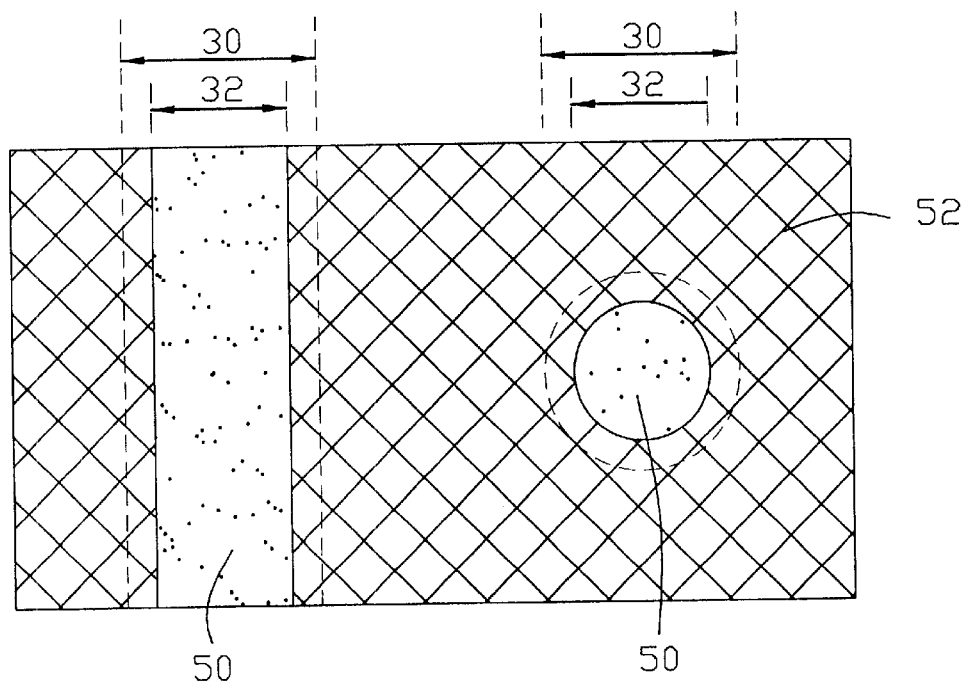

Referring to the upper diagram in FIG. 2A, a cross-sectional view of performing an over-exposure process is illustrated. Exposure light 20 transmits through the patterned reticle 60 exposing to the photosensitive layer 50 coated on the substrate 10 to form an exposed region 52 which is dissolved by a developer. Thus, the pattern of the reticle 60 is transferred to the unexposed regions of the photosensitive layer 50. It is clearly known that after the over-exposure process the actual dimension 32 of the unexposed region of the photosensitive layer 50 is smaller than the dimension 30 of the expected unexposed region of the reticle 60. As illustrated in FIG. 2B, a top view of a pattern transferred substrate 10 shows that the pattern such as a trench or a via is significantly shrunk when the pattern is transferred into the photosensitive layer 50. When performing the over-exposure process, the supplied energy exceeds the optimal energy, thus the exceeding energy diffuses to the peripheral region resulting in the increase of the exposed region 52 and the reduction of the unexposed region 50.

Therefore, the over-exposure process causes the reduction of the unexposed region that greatly improves the shrinkage of the critical dimension. In cooperation of the present exposure technology with the present invention, the shrinkage of a critical dimension is accomplished by, for example, using a light source (I-line) with a wavelength of 365 nm in a critical dimension of 0.25 $\mu$m process, or using a light source (deep UV) with a wavelength 248 nm in a critical dimension of 0.13 $\mu$m process.

Figure 3:
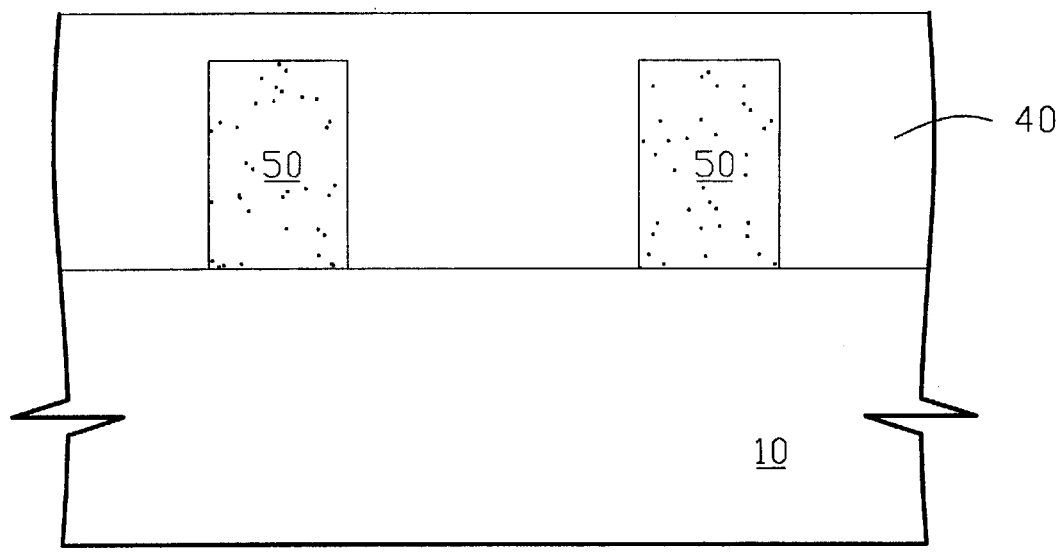
FIG. 3 is a cross-sectional view of the structure shown in FIG. 2A when the exposed region of the photosensitive layer is removed and a sacrificial layer is formed.

Referring to FIG. 3, the exposed region 52 is removed by a developer. Then, a sacrificial layer 40, which is used for reverse-transferring pattern of the photosensitive layer 50, is formed on the substrate 10 and covers the photosensitive layer 50. The sacrificial layer is formed by a spin-on glass technique such as a phosphosilicate glass (PSG) layer coated on the photosensitive layer 50 and the substrate 10. Additionally, the sacrificial layer 40 can be an oxide layer, a nitride layer, a borophosphosilicate glass (BPSG) layer, a photosensitive material layer, or a polymer layer formed by, for example, deposition process or sputter technique.

Figure 4:
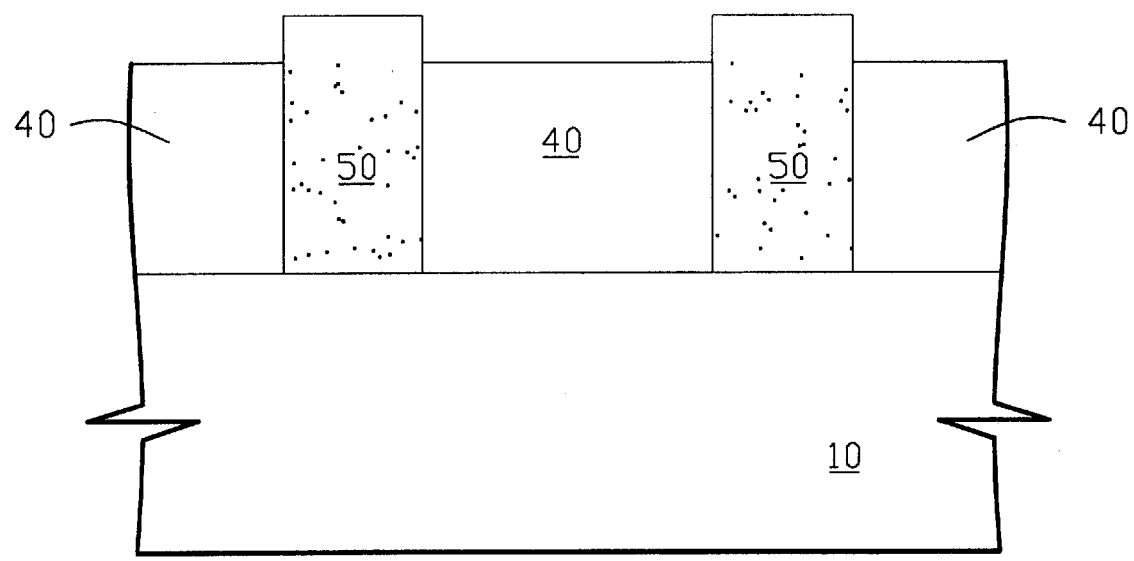
FIG. 4 is a cross-sectional view of the structure shown in FIG. 3 when a portion of the sacrificial layer is removed to expose the photosensitive layer.
Figure 5:
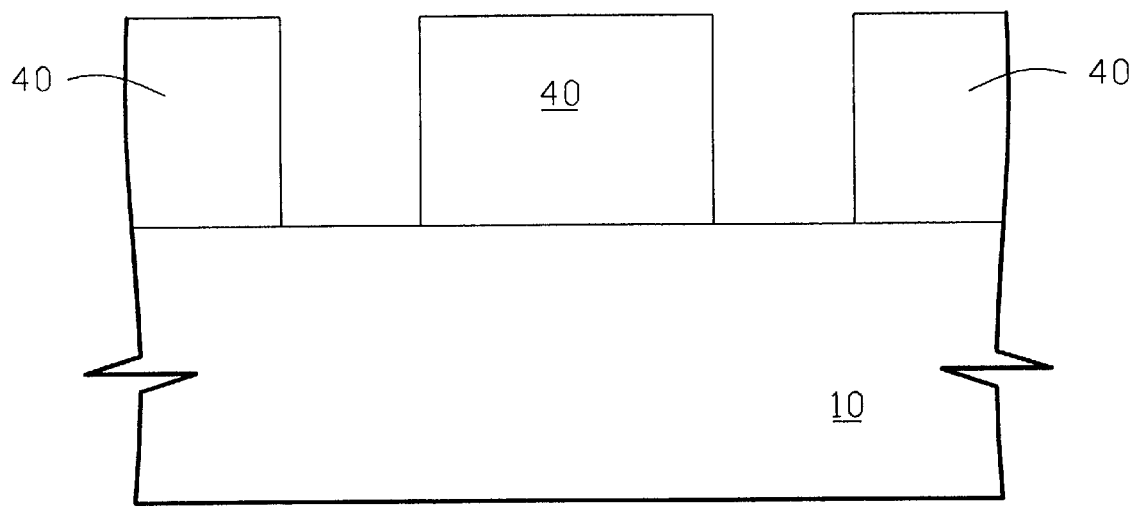
FIG. 5 is a cross-sectional view of the structure shown in FIG. 4 when the patterned photosensitive layer is removed.

Referring to FIG. 4 and FIG. 5, a portion of the sacrificial layer 40 is anisotropically etched to expose the photosensitive layer 50. Then, the photosensitive layer 50 is removed by use of a developer, and the pattern is reverse-transferred.

Figure 6:
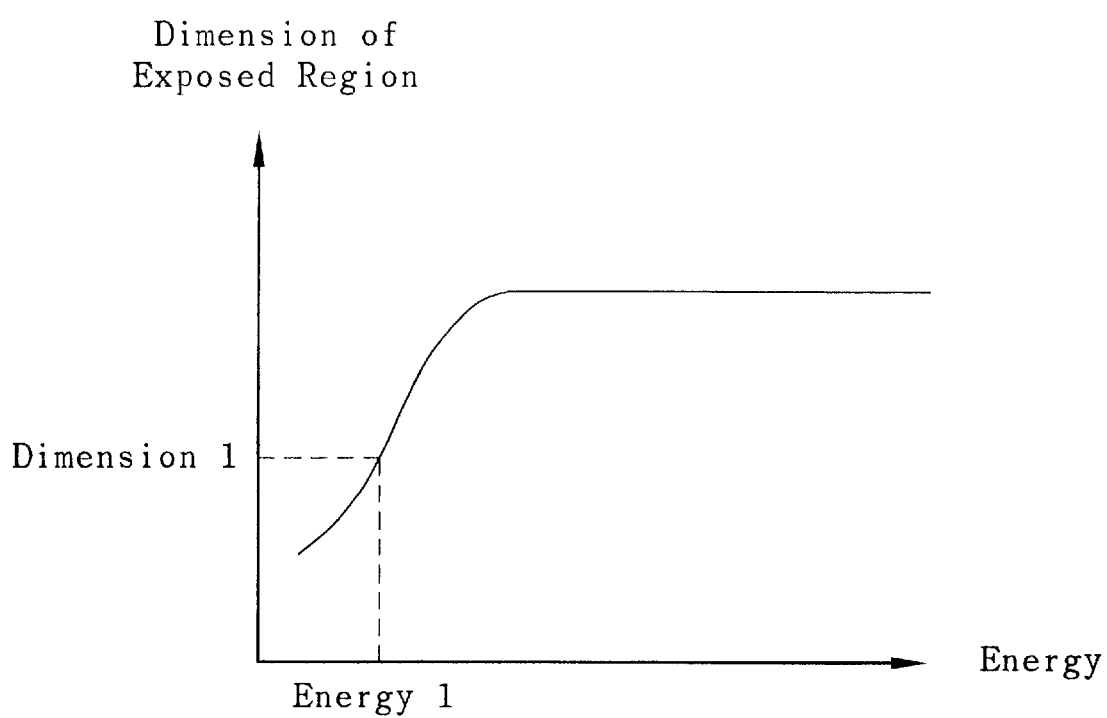
FIG. 6 is a diagram of showing the relation between the supplied energy and the dimension of exposed region in the exposure process.

Furthermore, referring to FIG. 6, a diagram shows the relation between the supplied energy and the dimension of exposed region in the exposure process. When the supplied energy is at the optimal level, the feature dimension of the expose region of the photoresist is equal to the expected dimension of the expose region of the reticle. For example, by supplying the optimal energy, Energy 1, the dimension of the exposed region of the photoresist is Dimension 1, which is the expected dimension of the exposed region of the reticle. However, as the supplied energy exceeds the optimal energy, an over-exposure process occurs. In the over-exposure process, the exceeding energy diffuses into the shielded region of the photoresist resulting in an increase of the exposed region, and the shrinkage of the unexposed region. A maximum dimension of the exposed region will be reached by continuously increasing the supplied energy in an over-exposure process. Hence, the unexposed region won't be eliminated in an over-exposure process. However, if the supplied energy is too high, the photoresist will be scorched resulting in damage of the underlying substrate. Thus, the supplied energy for the over-exposure is varied in accordance with process requirements.

In accordance with the present invention, a method for shrinking critical dimension in semiconductor processes is disclosed. This method comprises a step of performing an over-exposure process to a photosensitive layer to form a patterned photosensitive layer on a substrate by using a patterned reticle. Due to the unexposed region of the photosensitive layer being diminished by the over-exposure the critical dimension is shrunk. Then, a sacrificial layer is applied for the purpose of pattern reverse-transferring. Next, the patterned photosensitive layer is removed such that the pattern is transferred to the sacrificial layer with a shrunk critical dimension. In cooperation of the present exposure technology with the present invention, the shrinkage of a critical dimension is accomplished by, for example, using an I-line exposure light source in a critical dimension of 0.25 $\mu$m process, or using a deep UV (ultraviolet) exposure light source in a critical dimension of 0.13 $\mu$m process.

Although specific embodiments have been illustrated and described, it will be obvious to those skilled in the art that various modifications may be made without departing from what is intended to be limited solely by the appended claims.

What is claimed is:

1. A method for shrinking a critical dimension by over-exposure, said method comprising:

forming a photosensitive layer on a substrate;

providing a patterned reticle with a pattern to align with said substrate;

performing an over-exposure process to said photosensitive layer to form a patterned photosensitive layer by using said patterned reticle;

forming a sacrificial layer on said substrate and said patterned photosensitive layer;

anisotropically etching said sacrificial layer to expose said patterned photosensitive layer; and removing said patterned photosensitive layer to reverse transferring said pattern to said sacrificial layer.

2. The method according to claim 1, wherein said photosensitive layer is formed by spin coating.

3. The method according to claim 1, wherein said pattern is selected from the group consisting of a spacing, a line width, and a contact hole.

4. The method according to claim 1, wherein said step of performing said over-exposure process increases an exposed region and shrinks an unexposed region of said photosensitive layer.

5. The method according to claim 4, wherein said unexposed region is a region of shrinking said critical dimension.

6. The method according to claim 1, wherein said photosensitive layer is selected from the group consisting of a positive photoresist and a negative photoresist.

7. The method according to claim 1, wherein said sacrificial layer is selected from the group consisting of an oxide layer, a nitride layer, a phosphosilicate glass (PSG) layer, a borophosphosilicate glass (BPSG) layer, a photosensitive material layer, and a polymer layer.

8. The method according to claim 1, wherein said step of forming said sacrificial layer is selected from the group consisting of spin coating said sacrificial layer, depositing said sacrificial layer, and sputtering said sacrificial layer.

9. A method for shrinking a critical dimension by over-exposure, said method comprising:

forming a photosensitive layer on a substrate;

providing a patterned reticle with a pattern to align with said substrate;

performing an over-exposure process to said photosensitive layer to form a patterned photosensitive layer by using said patterned reticle, wherein said over-exposure process increases an exposed region and shrinks an unexposed region of said photosensitive layer, wherein said unexposed region is a region of shrinking said critical dimension;

forming a sacrificial layer on said substrate and said patterned photosensitive layer;

anisotropically etching said sacrificial layer to expose said patterned photosensitive layer; and removing said patterned photosensitive layer to reverse transferring said pattern to said sacrificial layer.

10. The method according to claim 9, wherein said pattern is selected form the group consisting of a spacing, a line width, and a contact hole.

11. The method according to claim 9, wherein said photosensitive layer is selected from the group consisting of a positive photoresist and a negative photoresist.

12. The method according to claim 9, wherein said sacrificial layer is selected from the group consisting of an oxide layer, a nitride layer, a phosphosilicate glass (PSG) layer, a borophosphosilicate glass (BPSG) layer, a photosensitive material layer, and a polymer layer.

13. The method according to claim 9, wherein said step of forming said sacrificial layer is selected from the group consisting of spin coating said sacrificial layer, depositing said sacrificial layer, and sputtering said sacrificial layer.

14. A method for shrinking a critical dimension in semiconductor process, said method comprising:

spin-coating a photosensitive layer on a substrate;

providing a reticle to align with said substrate, wherein said reticle has a pattern;

performing an over-exposure process to transfer said pattern to said photosensitive layer to form an exposed region and an unexposed region in said photosensitive layer, wherein said exposed region of said photosensitive layer is increased and said unexposed region of said photosensitive layer is shrunk;

performing a development process to form a patterned photosensitive layer;

forming a sacrificial layer on said substrate and said patterned photosensitive layer;

etching back said sacrificial layer to expose said patterned photosensitive layer; and removing said patterned photosensitive layer to reverse transferring said pattern to said sacrificial layer.

15. The method according to claim 14, wherein said photosensitive layer is selected from the group consisting of a positive photoresist and a negative photoresist.

16. The method according to claim 14, wherein said pattern is selected from the group consisting of a spacing, a line width, and a contact hole.

17. The method according to claim 14, wherein said sacrificial layer is selected from the group consisting of an oxide layer, a nitride layer, a phosphosilicate glass (PSG) layer, a borophosphosilicate glass (BPSG) layer, a photosensitive material layer, and a polymer layer.

18. The method according to claim 14, wherein said step of forming said sacrificial layer is selected from the group consisting of spin coating said sacrificial layer, depositing said sacrificial layer, and sputtering said sacrificial layer.

19. The method according to claim 14, wherein said step of etching back said sacrificial layer comprises anisotropically etching said sacrificial layer.

* * * * *